United States Patent
Kadowaki

(10) Patent No.: US 11,404,110 B2
(45) Date of Patent: Aug. 2, 2022

(54) SENSE AMPLIFICATION DEVICE IN MEMORY

(71) Applicant: Winbond Electronics Corp., Taichung (TW)

(72) Inventor: Takuya Kadowaki, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/928,010

(22) Filed: Jul. 14, 2020

(65) Prior Publication Data

US 2022/0020421 A1   Jan. 20, 2022

(51) Int. Cl.
| | | |
|---|---|---|
| *G11C 11/408* | (2006.01) | |
| *G11C 11/4091* | (2006.01) | |
| *G11C 11/4094* | (2006.01) | |
| *G11C 11/4074* | (2006.01) | |
| *G11C 11/4072* | (2006.01) | |

(52) U.S. Cl.
CPC ...... *G11C 11/4091* (2013.01); *G11C 11/4072* (2013.01); *G11C 11/4074* (2013.01); *G11C 11/4085* (2013.01); *G11C 11/4094* (2013.01)

(58) Field of Classification Search
CPC ............ G11C 11/4085; G11C 11/4094; G11C 11/4091; G11C 11/4072; G11C 11/4074
See application file for complete search history.

(56) References Cited

U.S. PATENT DOCUMENTS

| | | | | |
|---|---|---|---|---|
| 5,781,488 A | * | 7/1998 | Liu ...................... | G11C 7/1048 365/205 |
| 6,091,629 A | * | 7/2000 | Osada ................. | G06F 12/0802 365/220 |
| 6,154,064 A | * | 11/2000 | Proebsting ............. | G11C 7/062 327/55 |

(Continued)

FOREIGN PATENT DOCUMENTS

| | | | | |
|---|---|---|---|---|
| CN | 110232944 | | 9/2019 | |
| EP | 2784521 A1 | * | 10/2014 | ............ G01D 3/036 |

(Continued)

OTHER PUBLICATIONS

"Office Action of Korea Counterpart Application" with English translation thereof, dated Apr. 30, 2021, p. 1-p. 5.

(Continued)

*Primary Examiner* — Mushfique Siddique
(74) *Attorney, Agent, or Firm* — JCIPRNET

(57) ABSTRACT

A sense amplification device is provided. The sense amplification device includes a first sense amplifier, a second sense amplifier, and a third sense amplifier. An input terminal of the first sense amplifier is coupled to a first bit line. An input terminal of the second sense amplifier is coupled to a second bit line. The third sense amplifier has a differential input pair and a differential output pair, wherein a first input terminal of the differential input pair is coupled to an output terminal of the first sense amplifier, a second input terminal of the differential input pair is coupled to an output terminal of the second sense amplifier, a first output terminal (Continued)

of the differential output pair is coupled to the input terminal of the first sense amplifier, and a second output terminal of the differential output pair is coupled to the input terminal of the second sense amplifier.

9 Claims, 10 Drawing Sheets

(56) References Cited

U.S. PATENT DOCUMENTS

| | | | | |
|---|---|---|---|---|
| 6,208,574 | B1* | 3/2001 | Hardee | G11C 7/1096 |
| | | | | 365/205 |
| 6,424,554 | B1 | 7/2002 | Kawasumi | |
| 6,473,349 | B1* | 10/2002 | Flannagan | G11C 7/065 |
| | | | | 365/205 |
| 7,088,630 | B2* | 8/2006 | Hung | G11C 7/065 |
| | | | | 365/185.2 |
| 8,462,572 | B2* | 6/2013 | Sharma | G11C 7/06 |
| | | | | 365/207 |
| 2002/0048187 | A1 | 4/2002 | Pierin et al. | |
| 2005/0237835 | A1* | 10/2005 | Hung | G11C 7/065 |
| | | | | 365/207 |
| 2012/0300566 | A1* | 11/2012 | Mueller | G11C 7/12 |
| | | | | 365/203 |
| 2015/0269978 | A1 | 9/2015 | Jung et al. | |

FOREIGN PATENT DOCUMENTS

| | | |
|---|---|---|
| KR | 20000004477 | 1/2000 |
| TW | I508270 | 11/2015 |

OTHER PUBLICATIONS

"Office Action of Taiwan Counterpart Application", dated May 24, 2021, p. 1-p. 4.

\* cited by examiner

SENSE AMPLIFICATION DEVICE IN MEMORY

BACKGROUND

Technical Field

The disclosure relates to a signal amplification circuit, and particularly relates to a sense amplification device.

Description of Related Art

FIG. 1 shows a circuit block diagram of a memory cell array in a dynamic random access memory (DRAM) 100. The memory cell array of the DRAM 100 includes multiple sub-arrays 110-140. Each of the sub-arrays 110 to 140 has multiple bit lines BL0 and BL1, multiple word lines (not shown), and multiple memory cells (not shown). According to design requirements, the sub-arrays 110 to 140 may be conventional memory cell arrays and other memory cell arrays, so there will be no reiteration.

The DRAM 100 shown in FIG. 1 also includes multiple sense amplifiers. The bit lines of two sub-arrays share one sense amplifier. Each of the sense amplifiers is a differential signal amplifier. That is, each of the sense amplifiers has a differential pair. A first terminal and a second terminal of the differential pair are respectively coupled to a bit line of different sub-arrays. For example, the first terminal of the differential pair of a sense amplifier 150 is coupled to the bit line BL0 of the sub-array 110, and the second terminal of the differential pair of the sense amplifier 150 is coupled to the bit line BL1 of the sub-array 120.

The first terminal and the second terminal of the differential pair of the sense amplifier 150 shown in FIG. 1 have the same bit line capacitance. Load capacitance matching may be used for high-precision differential sensing. As shown in FIG. 1, since there is no sense amplifier on one side of an edge sub-array (for example, sub-array 110 or 140), bit line capacitance matching is impossible. The edge sub-arrays 110 and 140 include dummy bit lines (represented by dotted lines), and multiple dummy memory cells (not shown) connected to the dummy bit lines. Generally speaking, a pseudo memory cell is an idle memory cell that is not used. Therefore, half of the memory cells in the edge sub-array are unavailable.

FIG. 2 shows the sense amplifier 150, the bit line BL0, and the bit line BL1 shown in FIG. 1. FIG. 3 shows waveform diagrams of a word line WL, a control signal CSP, a control signal CSN, a data SN, the bit line BL0, and the bit line BL1 shown in FIG. 2. The horizontal axis shown in FIG. 3 represents time, and the vertical axis represents level of signal. Please refer to FIG. 2 and FIG. 3. A first power terminal of the sense amplifier 150 shown in FIG. 2 receives the control signal CSP, and a second power terminal of the sense amplifier 150 receives the control signal CSN. A condenser CBL shown in FIG. 2 represents the parasitic capacitance of the bit line BL0 and the bit line BL1. A memory cell MC shown in FIG. 2 represents one of the multiple memory cells coupled to the bit line BL1 in the sub-array 120. The memory cell MC shows an equivalent circuit, including a switch SW and a memory element $C_{SN}$. A first terminal of the switch SW is coupled to the bit line BL1. A second terminal of the switch SW is coupled to the memory element $C_{SN}$. A control terminal of the switch SW is coupled to one word line WL among multiple word lines in the sub-array 120. When the word line WL turns on the switch SW, the sense amplifier 150 may sense (read) the data SN of the memory cell MC via the bit line BL1, thereby amplifying the level of the data SN. A sense signal (level difference between the bit line BL0 and the bit line BL1) may be expressed as $$dV_{SIG} = \frac{C_{SN}}{C_{SN} + C_{BL}} \cdot dV_{SN}.$$

The sense amplifier 150 includes an n-channel metal oxide semiconductor (NMOS) pair and a p-channel metal oxide semiconductor (PMOS) pair. Vth mismatch between paired transistors in the sense amplifier 150 occurs due to process variation. Therefore, a sense signal $dV_{SIG}$ must be greater than the Vth mismatch for the sense amplifier 150 to correctly detect the sense signal $dV_{SIG}$. However, as the process shrinks, the capacitance of the cell storage node (CSN) decreases and the sense signal $dV_{SIG}$ becomes smaller. In addition, as the number of sense amplifiers on the wafer increases, the Vth mismatch will also increase statistically. Therefore, sense signal margin decreases as the process shrinks.

It should be noted that the content of "Description of Related Art" paragraph is used to help understand the disclosure. Some content (or all of the content) disclosed in the "Description of Related Art" paragraph may not be the prior art known by persons skilled in the art. The content disclosed in the "Description of Related Art" paragraph does not mean that the content has been known by persons skilled in the art before the application of the disclosure.

SUMMARY

The disclosure provides a sense amplification device for sensing (reading) data of bit lines.

In an embodiment of the disclosure, the sense amplification device includes a first sense amplifier, a second sense amplifier, and a third sense amplifier. An input terminal of the first sense amplifier is coupled to a first bit line. An input terminal of the second sense amplifier is coupled to a second bit line. The third sense amplifier has a differential input pair and a differential output pair. A first input terminal of the differential input pair is coupled to an output terminal of the first sense amplifier, a second input terminal of the differential input pair is coupled to an output terminal of the second sense amplifier, a first output terminal of the differential output pair is coupled to the input terminal of the first sense amplifier, and a second output terminal of the differential output pair is coupled to the input terminal of the second sense amplifier.

Based on the above, the first sense amplifier and/or the second sense amplifier according to the embodiments of the disclosure can amplify small signals on the bit lines. The third sense amplifier can receive amplified differential signals. Therefore, the sense amplification device can sense (read) the data of the bit lines.

To make the aforementioned and other features of the disclosure more comprehensible, several embodiments accompanied with drawings are described in detail as follows.

DETAILED DESCRIPTION OF DISCLOSED EMBODIMENTS

Figure 1:
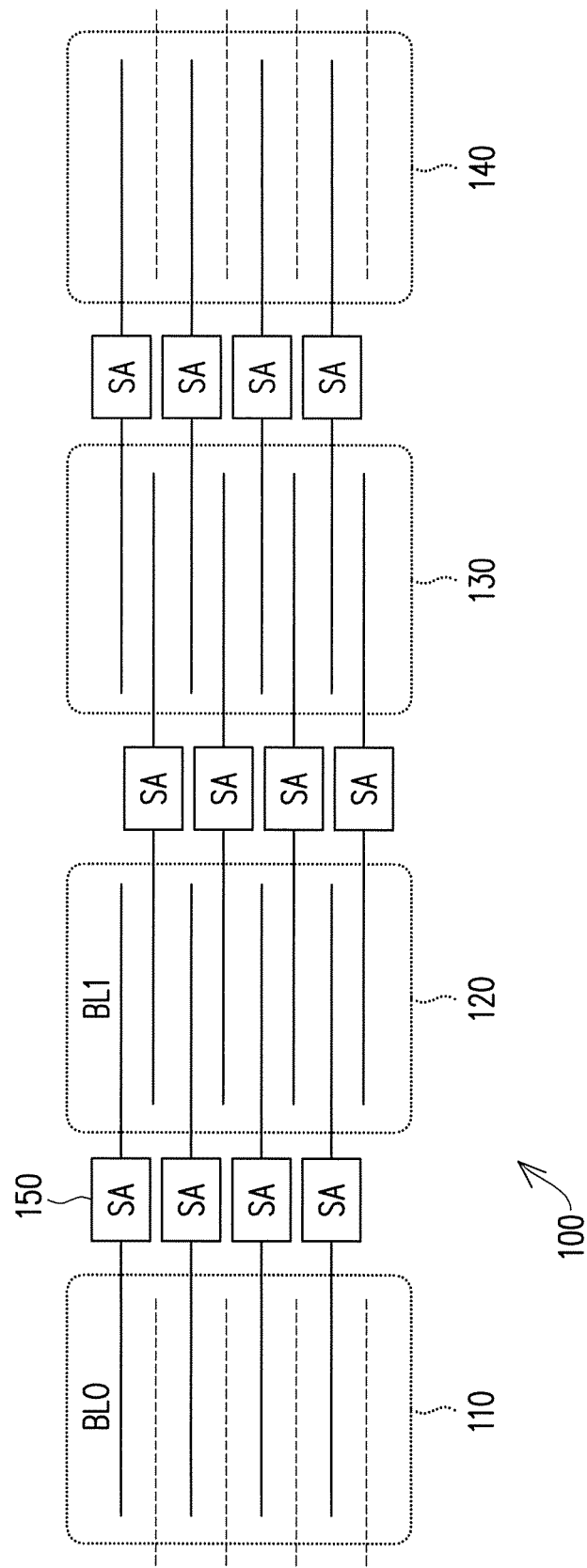
FIG. 1 shows a circuit block diagram of a memory cell array in a dynamic random access memory.

The term "coupling (or connection)" used in the entire specification (including the claims) of the disclosure may refer to any direct or indirect connection means. For example, if the text describes that a first device is coupled (or connected) to a second device, it should be interpreted that the first device may be directly connected to the second device, or the first device may be indirectly connected to the second device through another device or a certain connection means. In addition, wherever possible, elements/components/steps using the same reference numerals in the drawings and embodiments represent the same or similar parts. Elements/components/steps using the same reference numerals or using the same terminology in different embodiments may be cross-referenced for relevant descriptions.

Figures 2, 3:
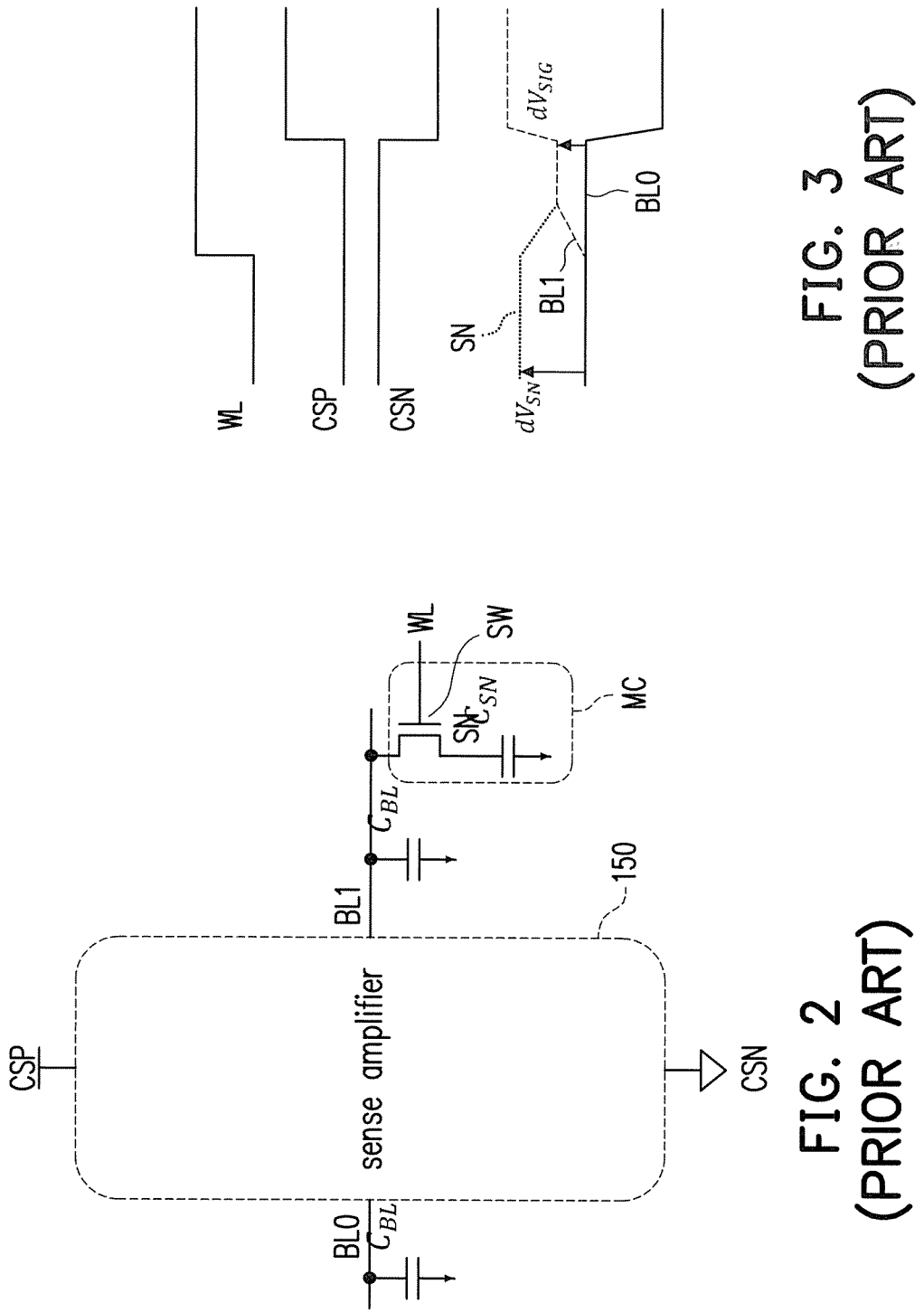
FIG. 2 shows a sense amplifier and bit lines shown in FIG. 1.
FIG. 3 shows waveform diagrams of a word line, control signals, data, and the bit lines shown in FIG. 2.
Figure 4:
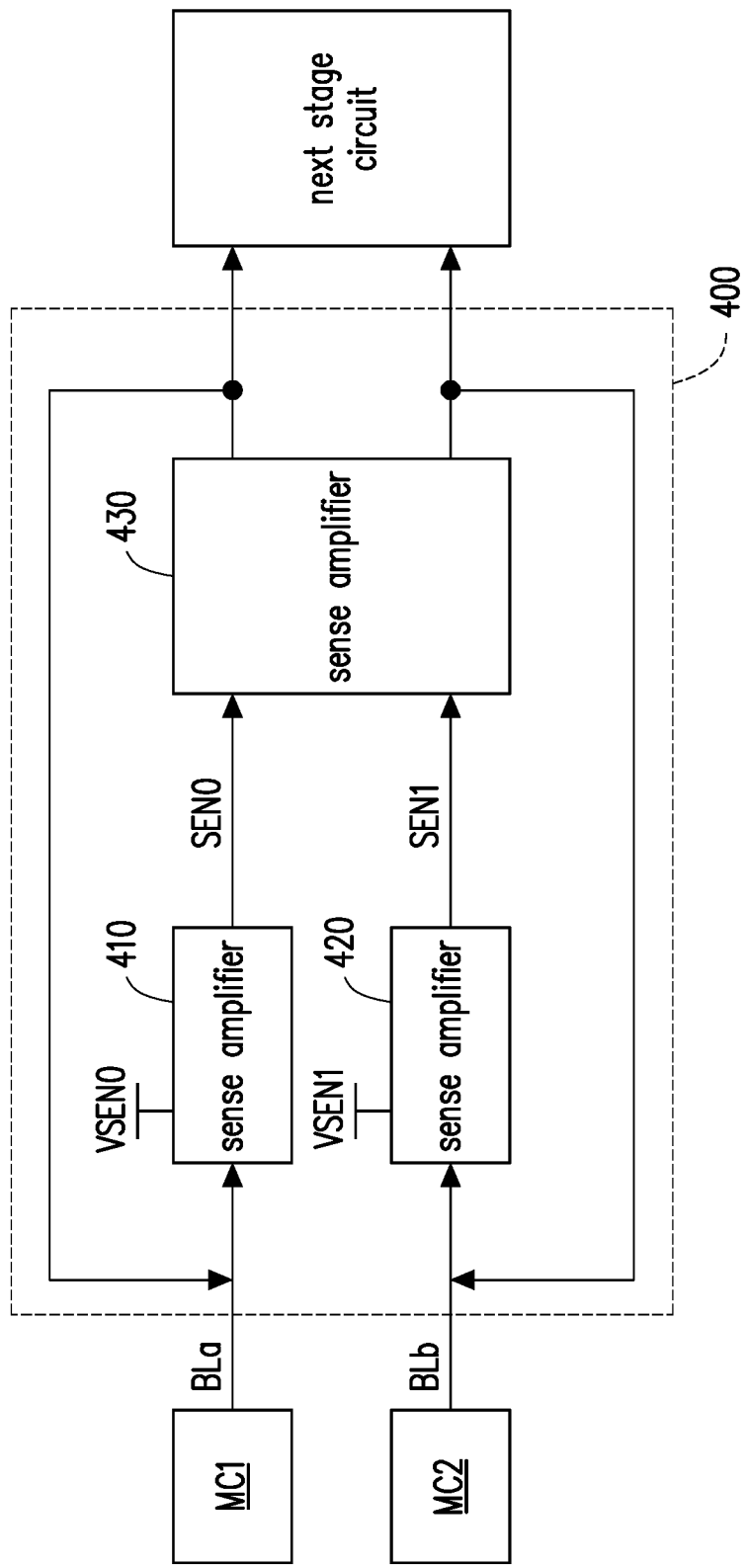
FIG. 4 is a circuit block diagram of a sense amplification device according to an embodiment of the disclosure.

FIG. 4 is a circuit block diagram of a sense amplification device 400 according to an embodiment of the disclosure. The sense amplification device 400 may be a two stages sense amplifier. In the embodiment, the sense amplification 400 includes sense amplifiers 410 to 430. An input terminal of the sense amplifier 410 is coupled to a bit line BLa. An input terminal of the sense amplifier 420 is coupled to a bit line BLb. The bit line BLa and the bit line BLb may be analogized by referring to the relevant descriptions of the bit lines BL0 and BL1 shown in FIG. 1 and FIG. 2.

The bit line BLa is coupled to multiple memory cells (for example, memory cell MC1) in a sub-array of a memory cell array in a dynamic random access memory (DRAM). The bit line BLb is coupled to multiple memory cells (for example, memory cell MC2) in another sub-array of the memory cell array. The sub-array may be analogized by referring to the relevant descriptions of the sub-arrays 110 to 140 shown in FIG. 1, and the memory cell MC1 and the memory cell MC2 may be analogized by referring to the relevant descriptions of the memory cell MC shown in FIG. 2.

The sense amplifiers 410 and 420 may be non-differential signal amplifiers (single-end signal amplifiers) or any suitable type of amplifiers. The sense amplifier 410 may sense and amplify the signal on the bit line BLa and output the amplified signal to a node SEN0. The sense amplifier 420 may also sense and amplify the signal on the bit line BLb and output the amplified signal to a node SEN1. When the sense amplifier 410 outputs the amplified signal corresponding to the signal on the bit line BLa to the node SEN0, the sense amplifier 420 may set the node SEN1 to the level of a reference voltage VSEN1 (for example, 1.2V). When the sense amplifier 420 outputs the amplified signal corresponding to the signal on the bit line BLb to the node SEN1, the sense amplifier 410 may set the node SEN0 to the level of a reference voltage VSEN0 (for example, 1.2V).

The sense amplifier 430 may be a differential signal amplifier. The sense amplifier 430 has a differential input pair and a differential output pair. A first input terminal of the differential input pair is coupled to an output terminal of the sense amplifier 410 through the node SEN0, and a second input terminal of the differential input pair is coupled to an output terminal of the sense amplifier 420 through the node SEN1. The differential output pair of the sense amplifier 430 may provide the sense results for the bit line BLa and the bit line BLb to a next stage circuit (for example, an analog-to-digital converter). In addition, a first output terminal of the differential output pair is coupled to the input terminal of the sense amplifier 410, and a second output terminal of the differential output pair is coupled to the input terminal of the sense amplifier 420. Therefore, the sense amplifier 430 may sense and amplify the differential voltage between the nodes SEN0 and SEN1, and output the amplified signals to the bit lines BLa and BLb.

In the sense amplification device 400, the small signals on the bit lines BLa and BLb are respectively amplified by the first stage sense amplifiers 410 and 420. Then, the amplified signals are outputted to the second stage sense amplifier 430. Therefore, the intensity of the differential signal received by the sense amplifier 430 is greater than the intensity of the differential signal received by the sense amplifier 150 shown in FIG. 1. Therefore, despite the shrinking of the process, the embodiment shown in FIG. 4 can still implement sufficient sense signal margin. Therefore, the sense amplification device 400 has immunity to mismatch. In addition, the sense amplification device 400 does not require high-precision bit line capacitance matching. Therefore, an edge sub-array may be disposed with the sense amplification device 400 on both sides, and all memory cells of the edge sub-array may be used.

Figure 5:
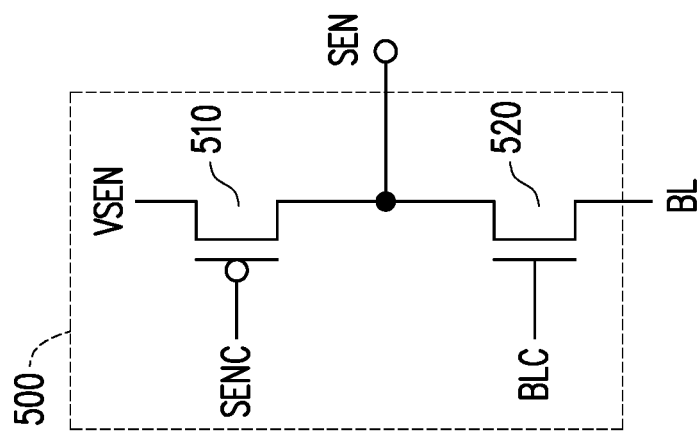
FIG. 5 is a circuit diagram of a sense amplifier according to an embodiment of the disclosure.

FIG. 5 is a circuit diagram of a sense amplifier 500 according to an embodiment of the disclosure. The sense amplifier 500 is suitable for the sense amplifiers 410 and 420 of FIG. 4. In FIG. 5, a reference voltage VSEN may be analogized with the reference voltage VSEN0 or VSEN1 of FIG. 4, a bit line BL may be analogized with the bit line BLa or BLb of FIG. 4, and a node SEN may be analogized with the node SEN0 or SEN1 of FIG. 4. The reference voltage VSEN, a control signal SENC, and a control signal BLC of FIG. 5 may be provided by other devices (not shown, such as a controller, a reference voltage generation circuit, etc.).

Please refer to FIG. 5. The sense amplifier 500 includes transistors 510 and 520. The transistor 510 includes a p-channel metal oxide semiconductor (PMOS) transistor or another transistor. The transistor 520 includes an n-channel metal oxide semiconductor (NMOS) transistor or another transistor. A first terminal (for example, source) of the transistor 510 is coupled to the reference voltage VSEN. A second terminal (for example, drain) of the transistor 510 is coupled to an output terminal of the sense amplifier 500 to output the amplified signal (or reference voltage VSEN) to the node SEN. A control terminal (for example, gate) of the transistor 510 is controlled by the control signal SENC. A first terminal (for example, source) of the transistor 520 is coupled to an input terminal of the sense amplifier 500 to receive the data signal of the bit line BL. A second terminal (for example, drain) of the transistor 520 is coupled to the second terminal of the transistor 510. A control terminal (for example, gate) of the transistor 520 is controlled by the control signal BLC.

Figure 6:
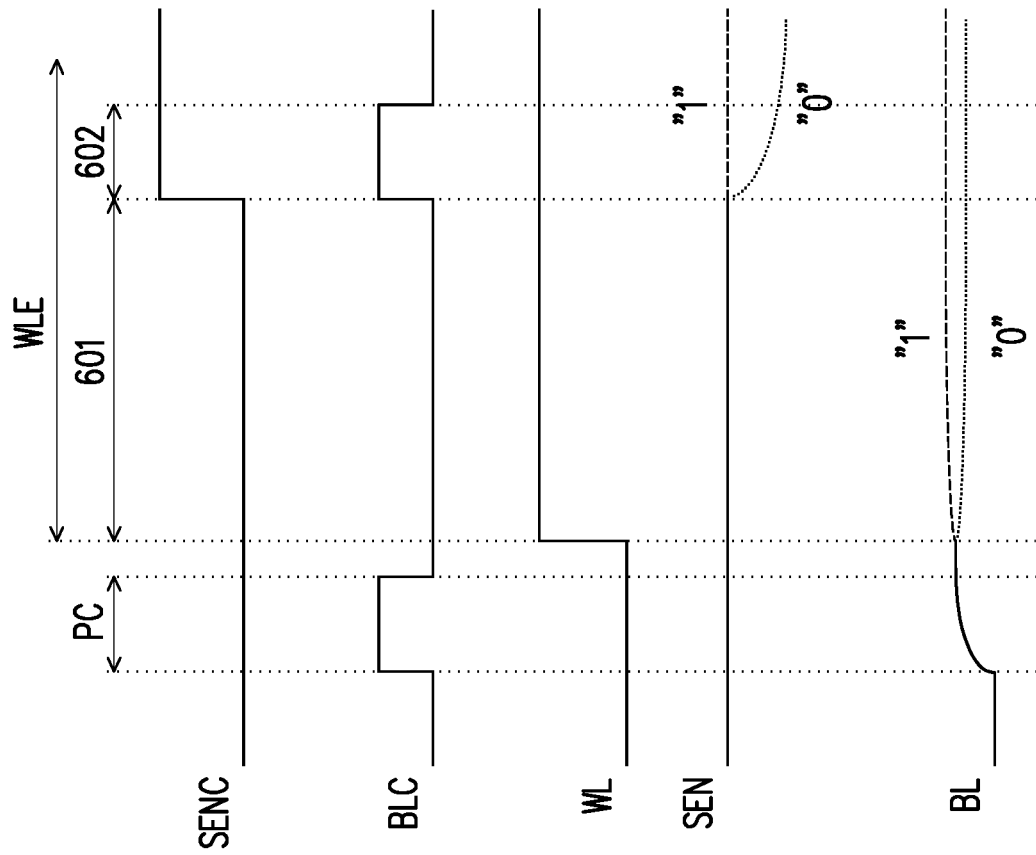
FIG. 6 is a timing diagram illustrating signals shown in FIG. 5 according to an embodiment of the disclosure.

FIG. 6 is a timing diagram illustrating signals shown in FIG. 5 according to an embodiment of the disclosure. The horizontal axis shown in FIG. 6 represents time, and the vertical axis represents level of signal. FIG. 6 shows the control signal on a word line WL. The period during which the control signal on the word line WL is at a high logic level is referred to as a word line enable period WLE. When the control signal on word line WL is at the high logic level, one corresponding memory cell in multiple memory cells coupled to the bit line BL will be selected, and the selected corresponding memory cell will output data to the bit line BL.

Please refer to FIG. 5 and FIG. 6. During a bit line pre-charge period PC, the control signal SENC turns on the transistor 510, and the control signal BLC drives the transistor 520 to pre-charge the bit line BL. The control signal BLC may drive the transistor 520 to set the level of the bit line BL to an appropriate pre-charge level (for example, 0.5V).

Next, before an initialization period 601 of the word line enable period WLE, the control signal SENC turns on the transistor 510 and the control signal BLC turns off the transistor 520. The transistor 510 may set the level of the node SEN to the pre-charge level (reference voltage VSEN) during the initialization period 601. After the transistor 520 is turned off, during the initialization period 601 of the word line enable period WLE, the word line WL turns on the memory cell to be read, causing the memory cell to be read to output data to the pre-charged bit line BL. When the data is "1", the level of the bit line BL becomes higher than the pre-charge level. When the data is "0", the level of the bit line BL becomes lower than the pre-charge level.

After the initialization period 601 ends, the control signal SENC turns off the transistor 510. Next, during a sense period 602 of the word line enable period WLE, the control signal SENC turns off the transistor 510, and the control signal BLC drives the transistor 520 to sense the bit line BL. During the sense period 602 and in the case where the data of the bit line BL is in a first logic state (for example, "1"), the transistor 520 is turned off, so that the node SEN is maintained at the pre-charge level (for example, 1.2V). During the sense period 602 and in the case where the data of the bit line BL is in a second logic state (for example, "0"), the transistor 520 is turned on. Since the capacitance of the node SEN is much smaller than the capacitance of the bit line BL, the node SEN is discharged to a level close to the bit line BL.

Figure 7:
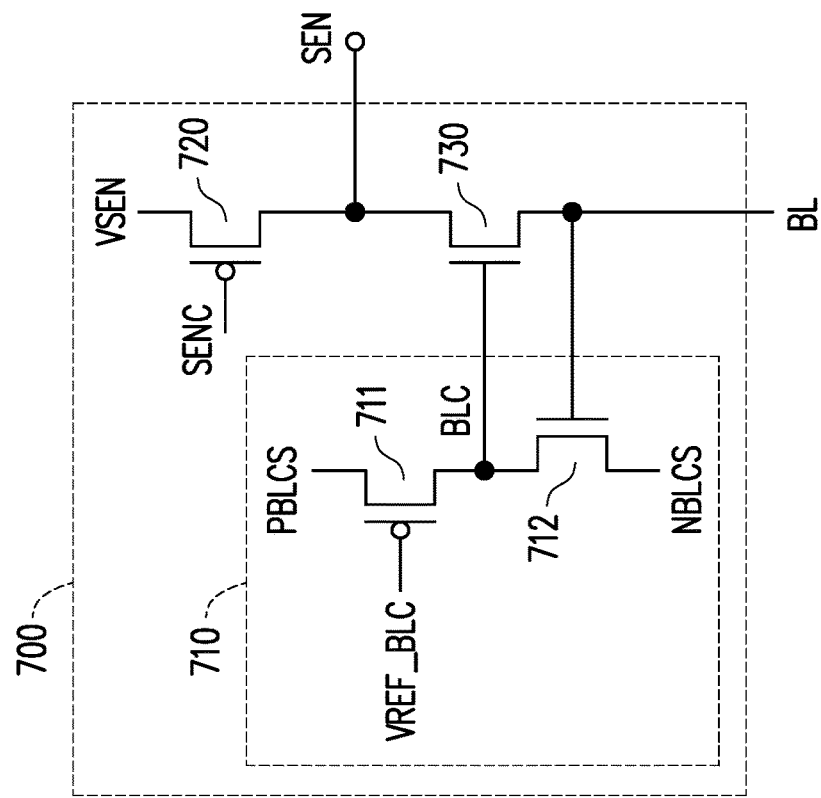
FIG. 7 is a circuit diagram of a sense amplifier according to another embodiment of the disclosure.

FIG. 7 is a circuit diagram of a sense amplifier 700 according to another embodiment of the disclosure. The sense amplifier 700 is suitable for the sense amplifiers 410 and 420 of FIG. 4. In FIG. 7, a reference voltage VSEN may be analogized with the reference voltage VSEN0 or VSEN1 of FIG. 4, a bit line BL may be analogized with the bit line BLa or BLb of FIG. 4, and a node SEN may be analogized with the node SEN0 or SEN1. The reference voltage VSEN, a control signal SENC, a control signal PBLCS, a reference voltage VREF_BLC, and a control signal NBLCS of FIG. 7 may be provided by other devices (not shown, such as a controller, a reference voltage generation circuit, etc.). According to design requirements, the reference voltage VREF_BLC may be a fixed voltage.

Please refer to FIG. 7. The sense amplifier 700 includes a control circuit 710, a transistor 720, and a transistor 730. The transistors 720 and 730 may be analogized by referring to the relevant descriptions of the transistors 510 and 520 of FIG. 5, so there will be no reiteration. A first terminal (for example, source) of the transistor 720 is coupled to the reference voltage VSEN. A second terminal (for example, drain) of the transistor 720 is coupled to an output terminal of the sense amplifier 700 to output the amplified signal (or reference voltage VSEN) to the node SEN. A control terminal (for example, gate) of the transistor 720 is controlled by the control signal SENC. A first terminal (for example, source) of the transistor 730 is coupled to an input terminal of the sense amplifier 700 to receive the data signal of the bit line BL. A second terminal of the transistor 730 (for example, drain) is coupled to the second terminal of the transistor 720. A control terminal (for example, gate) of the transistor 730 is controlled by a control signal BLC.

An input terminal of the control circuit 710 is coupled to the input terminal of the sense amplifier 700 to receive the data signal of the bit line BL. The control circuit 710 may generate the control signal BLC to the control terminal of the transistor 730. The control circuit 710 may dynamically adjust the control signal BLC according to the level of the input terminal of the sense amplifier 700 (level of the data signal of the bit line BL).

In the embodiment shown in FIG. 7, the control circuit 710 includes a transistor 711 and a transistor 712. The transistor 711 includes a PMOS transistor or another transistor. The transistor 712 includes an NMOS transistor or another transistor. A first terminal (for example, source) of the transistor 711 receives the control signal PBLCS. A second terminal (for example, drain) of the transistor 711 is coupled to an output terminal of the control circuit 710 to generate the control signal BLC to the control terminal of the transistor 730. A control terminal (for example, gate) of the transistor 711 is controlled by the reference voltage VREF_BLC. A first terminal (for example, source) of the transistor 712 receives the control signal NBLCS. A second terminal (for example, drain) of the transistor 712 is coupled to the second terminal of the transistor 711. A control terminal (for example, gate) of the transistor 712 is coupled to the input terminal of the control circuit 710 to receive the data signal of the bit line BL.

Figure 8:
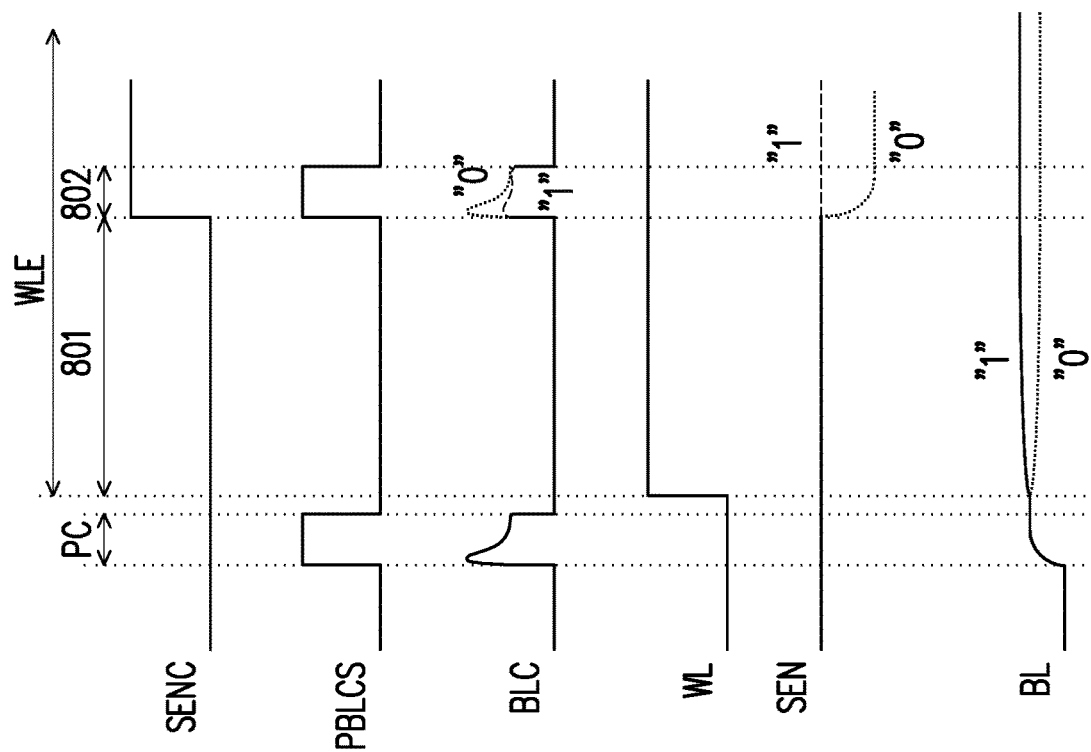
FIG. 8 is a timing diagram illustrating signals shown in FIG. 7 according to an embodiment of the disclosure.

FIG. 8 is a timing diagram illustrating signals shown in FIG. 7 according to an embodiment of the disclosure. Please refer to FIG. 7 and FIG. 8. During a bit line pre-charge period PC, the control signal PBLCS is pulled up, so the transistor 711 is turned on and the control signal BLC is pulled up. During the bit line pre-charge period PC, the control signal SENC turns on the transistor 720, and the control signal BLC drives the transistor 730 to pre-charge the bit line BL. The transistor 730 may set the level of the bit line BL to an appropriate pre-charge level (for example, 0.5V). The pre-charge level of the bit line BL is fed back to the control terminal of the transistor 712, so that the transistor 712 may dynamically adjust the level of the control signal BLC according to the level of the bit line BL.

After the bit line pre-charge period PC ends, the control signal PBLCS is pulled down, so the transistor 711 is turned off, so that the control signal BLC is pulled down by the transistor 712. Next, during an initialization period 801 of a word line enable period WLE, the control signal SENC turns on the transistor 720 and the control signal BLC turns off the transistor 730. The transistor 720 may set the level of the node SEN to the pre-charge level (reference voltage VSEN) during the initialization period 801. After the transistor 730 is turned off, a word line WL turns on the memory cell to be read, so that data is outputted to the pre-charged bit line BL.

After the initialization period 801 ends, the control signal SENC turns off the transistor 720. Then, during a sense period 802 of the word line enable period WLE, the control signal PBLCS is pulled up again, so the transistor 711 is turned on and the control signal BLC is pulled up. During the sense period 802, the control signal SENC turns off the transistor 720, and the control signal BLC drives the transistor 730 to sense the bit line BL. During the sense period 802 and in the case where the data of the bit line BL is in a first logic state (for example, "1"), the transistor 730 is turned off, so that the node SEN is maintained at the pre-charge level (for example, 1.2V). During the sense period 802 and in the case where the data of the bit line BL is in a second logic state (for example, "0"), the transistor 730 is turned on, so the node SEN is discharged to a level close to the bit line BL. The level of the bit line BL (level of the data voltage) is fed back to the control terminal of the transistor 712, so that the transistor 712 may dynamically adjust the level of the control signal BLC according to the level of the bit line BL.

During the bit line pre-charge period PC and the sense period 802, the control circuit 710 may dynamically control the control signal BLC according to the level of the bit line BL. Therefore, the sense amplifier 700 can implement high-speed bit line pre-charging and sensing.

Figure 9:
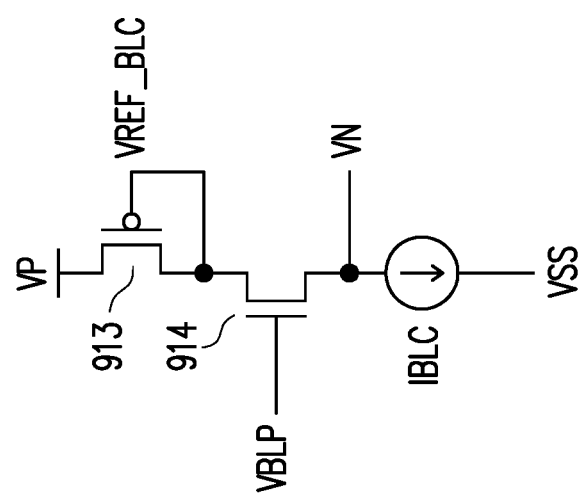
FIG. 9 is a circuit diagram of a voltage generation circuit according to another embodiment of the disclosure.

FIG. 9 is a circuit diagram of a voltage generation circuit according to an embodiment of the disclosure. A supply voltage VP, a bias voltage VBLP, and a reference voltage VSS shown in FIG. 9 may be provided by other devices (not shown, such as a controller, a reference voltage generation circuit, etc.). The bias voltage VBLP may be a bit line pre-charge level target (for example, 0.5V). The voltage generation circuit shown in FIG. 9 may provide voltage to the control circuit 710, and all sense amplifiers share one voltage generation circuit. In the voltage generator shown in FIG. 9, the level of the supply voltage VP is the same as the high logic level of the control signal PBLCS, and the level of an output voltage VN is the same as the low logic level of the control signal NBLCS. The bias voltage VBLP may control the level of the reference voltage VREF_BLC and the level of the output voltage VN, and the bit line pre-charge level becomes the same as the level of the bias voltage VBLP.

A first terminal (for example, source) of a transistor 913 receives the supply voltage VP. A second terminal (for example, drain) of the transistor 913 is coupled to a control terminal (for example, gate) of the transistor 913, and provides the reference voltage VREF_BLC. A first terminal (for example, drain) of a transistor 914 is coupled to the second terminal of the transistor 913. A second terminal (for example, source) of the transistor 914 is coupled to a current source IBLC, and provides the output voltage VN. A control terminal (for example, gate) of the transistor 914 receives the bias voltage VBLP. The current source IBLC is also coupled to the reference voltage VSS. The current source IBLC may control the current consumption in the control circuit 710 of the sense amplifier.

Figure 10:
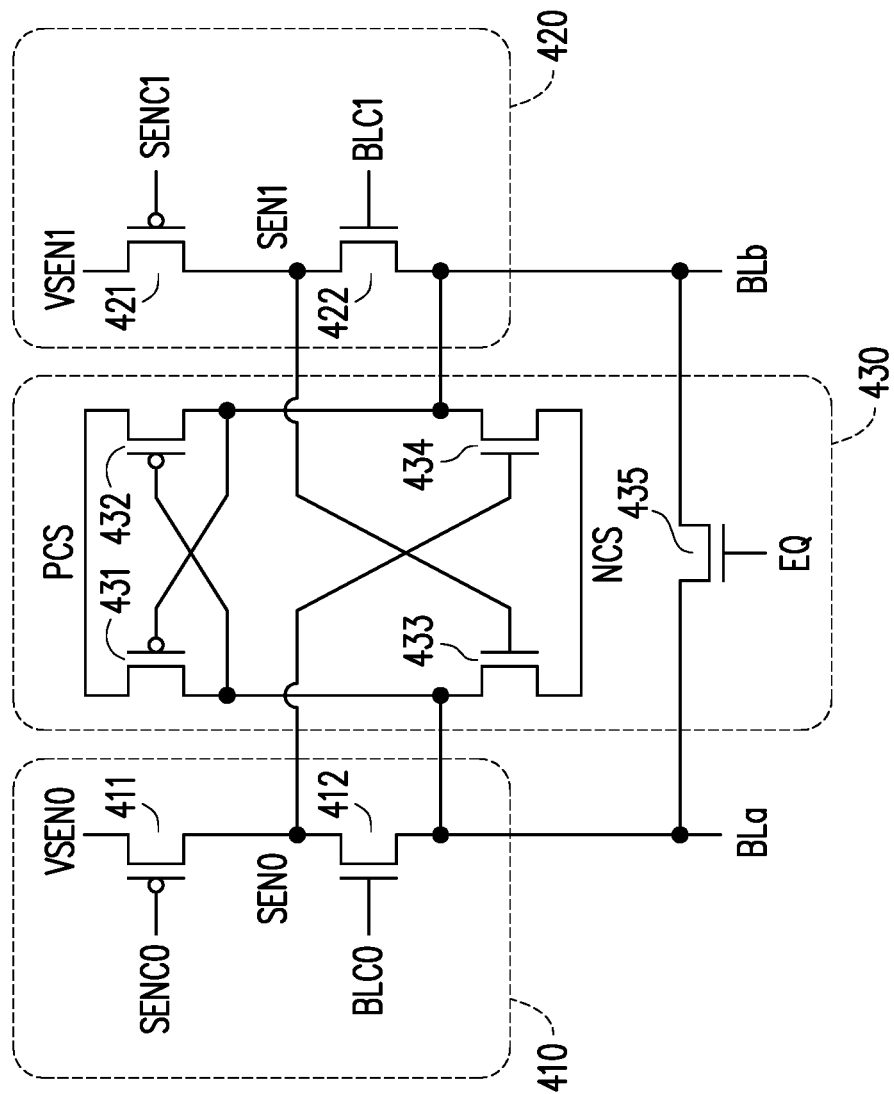
FIG. 10 is a circuit diagram illustrating sense amplifiers shown in FIG. 4 according to another embodiment of the disclosure.

FIG. 10 is a circuit diagram illustrating the sense amplifiers 410 to 430 shown in FIG. 4 according to another embodiment of the disclosure. Reference voltages VSEN0 and VSEN1, control signals SENC0 and SENC1, control signals BLC0 and BLC1, a voltage PCS, a voltage NCS, and a control signal EQ shown in FIG. 10 may be provided by other devices (not shown, such as a controller, a reference voltage generation circuit, etc.).

Please refer to FIG. 10. The sense amplifier 410 includes transistors 411 and 412. A first terminal (for example, source) of the transistor 411 is coupled to the reference voltage VSEN0. A second terminal (for example, drain) of the transistor 411 is coupled to an output terminal of the sense amplifier 410 to output the amplified signal (or reference voltage VSEN0) to a node SEN0. A control terminal (for example, gate) of the transistor 411 is controlled by the control signal SENC0. A first terminal (for example, source) of the transistor 412 is coupled to an input terminal of the sense amplifier 410 to receive the data signal of a bit line BLa. A second terminal (for example, drain) of the transistor 412 is coupled to the second terminal of the transistor 411. A control terminal (for example, gate) of the transistor 412 is controlled by the control signal BLC0. The sense amplifier 410, the transistor 411, and the transistor 412 shown in FIG. 10 may be analogized by referring to the relevant descriptions of the sense amplifier 500, the transistor 510, and the transistor 520 shown in FIG. 5, so there will be no reiteration.

The sense amplifier 420 includes transistors 421 and 422. A first terminal (for example, source) of the transistor 421 is coupled to the reference voltage VSEN1. A second terminal (for example, drain) of the transistor 421 is coupled to an output terminal of the sense amplifier 420 to output the amplified signal (or reference voltage VSEN1) to a node SEN1. A control terminal (for example, gate) of the transistor 421 is controlled by the control signal SENC1. A first terminal (for example, source) of the transistor 422 is coupled to an input terminal of the sense amplifier 420 to receive the data signal of a bit line BLb. A second terminal (for example, drain) of the transistor 422 is coupled to the second terminal of the transistor 421. A control terminal (for example, gate) of the transistor 422 is controlled by the control signal BLC1. The sense amplifier 420, the transistor 421, and the transistor 422 shown in FIG. 10 may be analogized by referring to the relevant descriptions of the sense amplifier 500, the transistor 510, and the transistor 520 shown in FIG. 5.

The sense amplifier 430 includes transistors 431 to 435. First and second terminals (for example, source and drain) of the transistor 435 are respectively coupled to the bit lines BLas and BLb. A control terminal (for example, gate) of the transistor 435 is controlled by the control signal EQ.

A first terminal (for example, source) of the transistor 431 and a first terminal (for example, source) of the transistor 432 are coupled to the voltage PCS. The level of voltage PCS may be determined according to design requirements. A second terminal (for example, drain) of the transistor 431 and a control terminal (for example, gate) of the transistor 432 are coupled to a first output terminal of the sense amplifier 430, wherein the first output terminal of the sense amplifier 430 may feed back the amplified signal to the input terminal of the sense amplifier 410. A control terminal (for example, gate) of the transistor 431 and a second terminal (for example, drain) of the transistor 432 are coupled to a second output terminal of the sense amplifier 430, wherein the second output terminal of the sense amplifier 430 may feed back the amplified signal to the input terminal of the sense amplifier 420.

A first terminal (for example, source) of the transistor 433 and a first terminal (for example, source) of the transistor 434 are coupled to the voltage NCS. The level of voltage NCS may be determined according to design requirements.

A second terminal (for example, drain) of the transistor 433 is coupled to the first output terminal of the sense amplifier 430, wherein the first output terminal of the sense amplifier 430 may feed back the amplified signal to the input terminal of the sense amplifier 410. A control terminal (for example, gate) of the transistor 433 is coupled to a second input terminal of the sense amplifier 430 to receive the amplified signal from the node SEN1 (or reference voltage VSEN1). A second terminal (for example, drain) of the transistor 434 is coupled to the second output terminal of the sense amplifier 430, wherein the second output terminal of the sense amplifier 430 may feed back the amplified signal to the input terminal of the sense amplifier 420. A control terminal (for example, gate) of the transistor 434 is coupled to the first input terminal of the sense amplifier 430 to receive the amplified signal from the node SEN0 (or reference voltage VSEN0).

Figure 11:
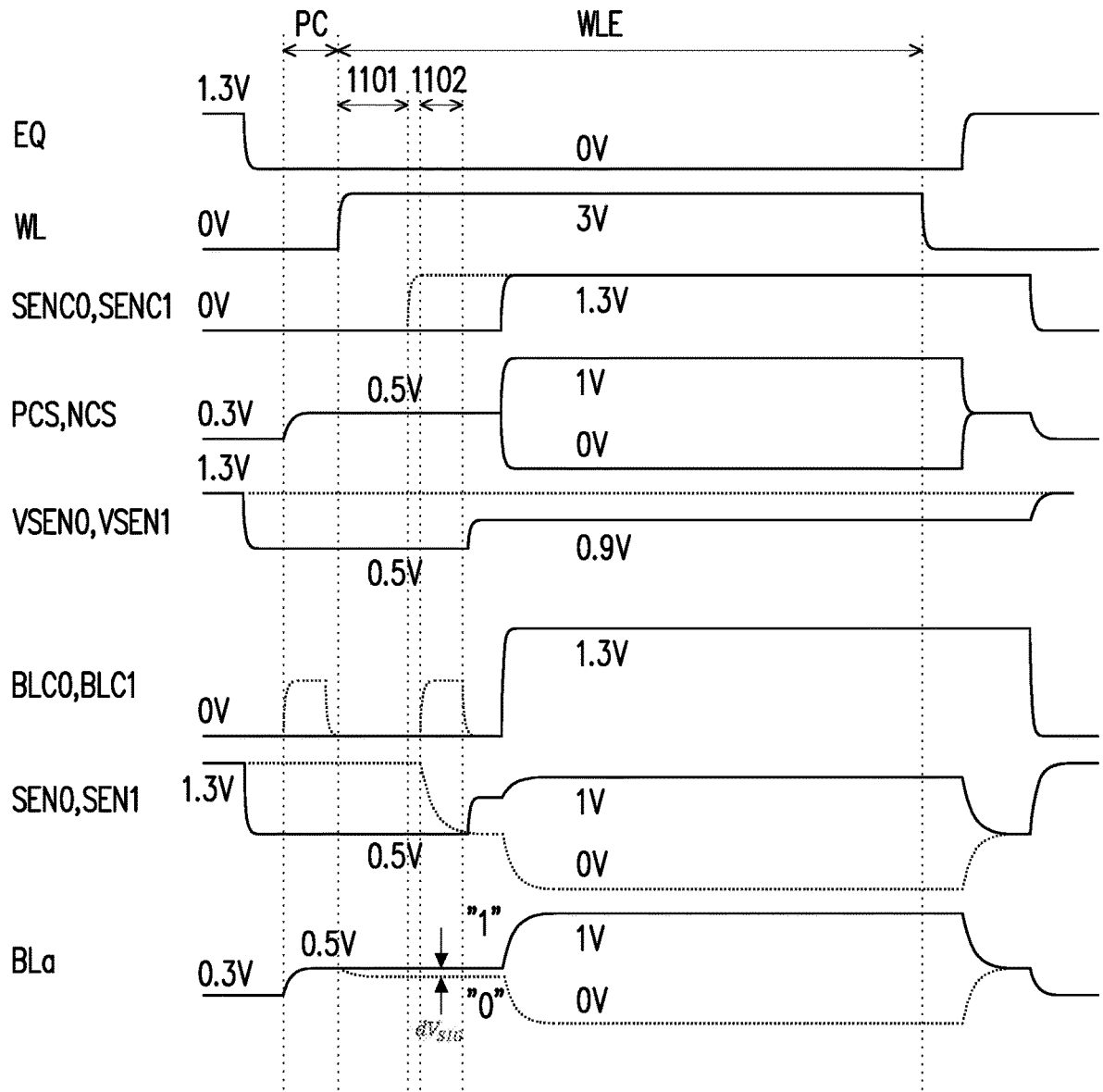
FIG. 11 is a timing diagram illustrating signals shown in FIG. 10 according to an embodiment of the disclosure.

FIG. 11 is a timing diagram illustrating signals shown in FIG. 10 according to an embodiment of the disclosure. In FIG. 11, the dashed waveforms represent signals with "0" (for example, SENC0, VSEN0, BLC0, and SEN0), and the solid lines represent signals with "1" (for example, SENC1, VSEN1, BLC1, and SEN1). Please refer to FIG. 10 and FIG. 11. During a bit line pre-charge period PC, the voltages PCS and NCS are pulled up (for example, from 0.3V to 0.5V), the reference voltage VSEN0 is at a high level (for example, 1.3V), the reference voltage VSEN1 is at a low level (for example, 0.5V), the control signals SENC0 and SENC1 are both at low levels (for example, 0V), the control signal BLC0 is at a high level, and the control signal BLC1 is at a low level (for example, 0V). Therefore, during the bit line pre-charge period PC, the transistor 412 may pre-charge the bit line BL0 (for example, from 0.3V to 0.5V), the transistor 411 may set the node SEN0 to the level of the reference voltage VSEN0 (for example, 1.3V), and the transistor 421 may set the node SEN1 to the level of the reference voltage VSEN1 (for example, 0.5V).

After the bit line pre-charge period PC ends, the control signal BLC0 is pulled down, so the transistor 412 is turned off. After the transistors 412 and 422 are turned off, the word line WL turns on the memory cell to be read, so that the memory cell to be read outputs data to the pre-charged bit line BLa. Next, during an initialization period 1101 of a word line enable period WLE, the control signals SENC0 and SENC1 turn on the transistors 411 and 421, and the control signals BLC0 and BLC1 turn off the transistors 412 and 422. The transistors 411 and 421 may set the levels of the nodes SEN0 and SEN1 to the levels of the reference voltages VSEN0 and VSEN1 during the initialization period 1101.

After the initialization period 1101 ends, the control signal SENC0 is pulled up (for example, from 0V to 1.3V) to turn off the transistor 411. Then, during a sense period 1102 of the word line enable period WLE, the control signal SENC0 is at a high level (for example, 1.3V) and the control signal SENC1 is at a low level (for example, 0V), so that when the sense amplifier 410 outputs the amplified signal of the corresponding signal on the bit line BLa to the node SEN0, the transistor 421 may set the node SEN1 to the level of the reference voltage VSEN1 (for example, 0.5V). During the sense period 1102, the control signal BLC0 is pulled up again and the control signal BLC1 is maintained at a low level, so the transistor 422 is turned off and the transistor 412 may sense the bit line BLa. During the period of the sense amplifier 410 sensing the bit line BLa, the control signal SENC1 turns on the transistor 421 and the control signal BLC1 turns off the transistor 422.

Figure 12:
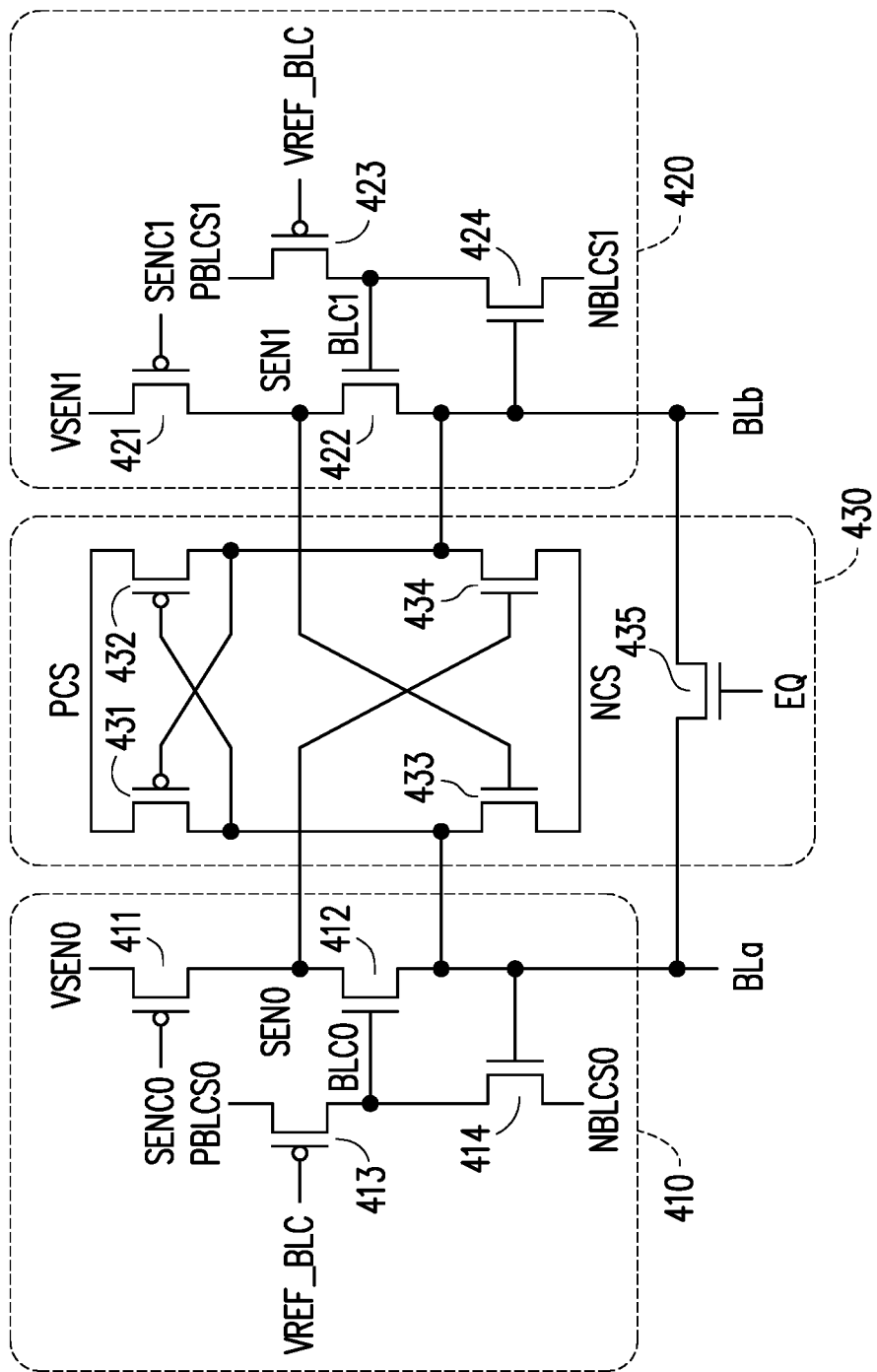
FIG. 12 is a circuit diagram illustrating the sense amplifiers shown in FIG. 4 according to yet another embodiment of the disclosure.

FIG. 12 is a circuit diagram illustrating the sense amplifiers 410 to 430 shown in FIG. 4 according to yet another embodiment of the disclosure. The sense amplifier 430 and transistors 431 to 435 in FIG. 12 may be analogized by referring to the relevant descriptions of the embodiment in FIG. 10, so there will be no reiteration. Reference voltages VSEN0 and VSEN1, control signals SENC0 and SENC1, control signals PBLCS0 and PBLCS1, control signals NBLCS0 and NBLCS1, a voltage PCS, a voltage NCS, a reference voltage VREF_BLC, and a control signal EQ shown in FIG. 12 may be provided by other devices (not shown, such as a controller, a reference voltage generation circuit, etc.).

Please refer to FIG. 12. The sense amplifier 410 includes transistors 411 to 414. A first terminal (for example, source) of the transistor 411 is coupled to the reference voltage VSEN0. A second terminal (for example, drain) of the transistor 411 is coupled to an output terminal of the sense amplifier 410 to output the amplified signal (or reference voltage VSEN0) to the node SEN0. A control terminal (for example, gate) of the transistor 411 is controlled by the control signal SENC0. A first terminal (for example, source) of the transistor 412 is coupled to an input terminal of the sense amplifier 410 to receive the data signal of the bit line BLa. A second terminal (for example, drain) of the transistor 412 is coupled to the second terminal of the transistor 411. A control terminal (for example, gate) of the transistor 412 is controlled by the control signal BLC0. A first terminal (for example, source) of the transistor 413 receives the control signal PBLCS0. A second terminal (for example, drain) of the transistor 413 is coupled to the control terminal of the transistor 412 to provide the control signal BLC0. A control terminal (for example, gate) of the transistor 413 is controlled by the reference voltage VREF_BLC. A first terminal (for example, source) of the transistor 414 receives the control signal NBLCS0. A second terminal (for example, drain) of the transistor 414 is coupled to the second terminal of the transistor 413. A control terminal (for example, gate) of the transistor 414 is coupled to the bit line BLa. The sense amplifier 410 and the transistors 411 to 414 of FIG. 12 may be analogized by referring to the relevant descriptions of the sense amplifier 700, the transistor 720, the transistor 730, the transistor 711, and the transistor 712 of FIG. 7, so there will be no reiteration.

The sense amplifier 420 includes transistors 421 to 424. A first terminal (for example, source) of the transistor 421 is coupled to the reference voltage VSEN1. A second terminal (for example, drain) of the transistor 421 is coupled to an output terminal of the sense amplifier 420 to output the amplified signal (or reference voltage VSEN1) to the node SEN1. A control terminal (for example, gate) of the transistor 421 is controlled by the control signal SENC1. A first terminal (for example, source) of the transistor 422 is coupled to an input terminal of the sense amplifier 420 to receive the data signal of the bit line BLb. A second terminal (for example, drain) of the transistor 422 is coupled to the second terminal of the transistor 421. A control terminal (for example, gate) of the transistor 422 is controlled by the control signal BLC1. A first terminal (for example, source) of the transistor 423 receives the control signal PBLCS1. A second terminal (for example, drain) of the transistor 423 is coupled to the control terminal of the transistor 422 to provide the control signal BLC1. A control terminal (for example, gate) of the transistor 423 is controlled by the reference voltage VREF_BLC. A first terminal (for example, source) of the transistor 424 receives the control signal NBLCS1. A second terminal (for example, drain) of the transistor 424 is coupled to the second terminal of the transistor 423. A control terminal (for example, gate) of the transistor 424 is coupled to the bit line BLb. The sense amplifier 420 and the transistors 421 to 424 of FIG. 12 may be analogized by referring to the relevant descriptions of the sense amplifier 700, the transistor 720, the transistor 730, the transistor 711, and the transistor 712 shown in FIG. 7, so there will be no reiteration.

Figure 13:
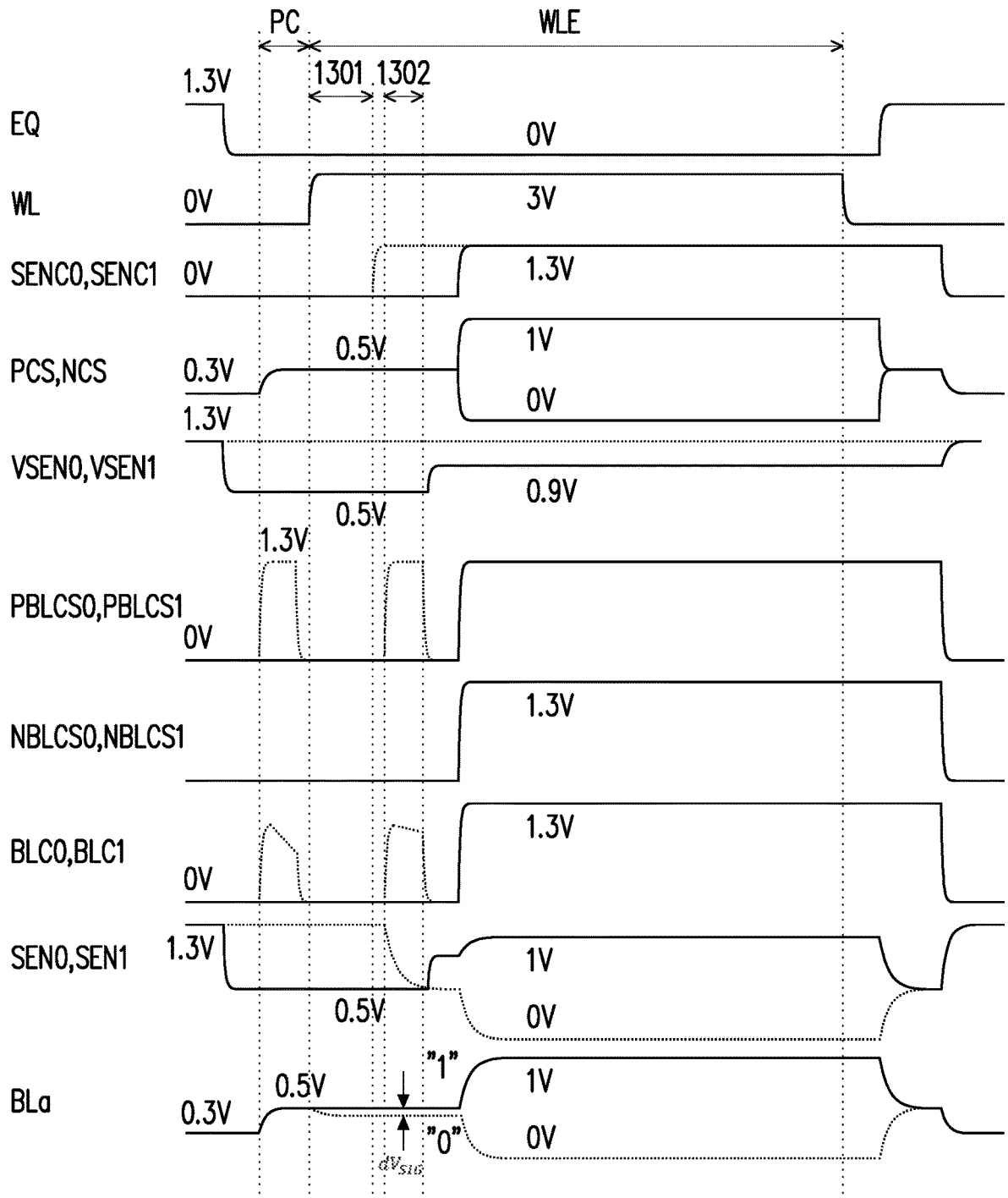
FIG. 13 is a timing diagram illustrating signals shown in FIG. 12 according to an embodiment of the disclosure.

FIG. 13 is a timing diagram illustrating signals shown in FIG. 12 according to an embodiment of the disclosure. In FIG. 13, the dashed waveforms represent signals with "0" (for example, SENC0, VSEN0, PBLCS0, BLC0, and SEN0), and the solid lines represent signals with "1" (for example, SENC1, VSEN1, PBLCS, BLC1, and SEN1). Please refer to FIG. 12 and FIG. 13. During a bit line pre-charge period PC, the voltages PCS and NCS are pulled up (for example, from 0.3V to 0.5V), the reference voltage VSEN0 is at a high level (for example, 1.3V), the reference voltage VSEN1 is at a low level (for example, 0.5V), the control signals SENC0 and SENC1 are both at low levels (for example, 0V), the control signal PBLCS0 is at a high level (for example, 1.3V), the control signal PBLCS1 is at a low level (for example, 0V), the control signals NBLCS0 and NBLCS1 are both at low levels. Therefore, during the bit line pre-charge period PC, the control signal BLC0 is pulled up, so that the transistor 412 may pre-charge the bit line BL0 (for example, from 0.3V to 0.5V), and the control signal BLC1 is maintained at a low level (for example, 0V), so that the transistor 422 is turned off. During the bit line pre-charge period PC, the transistor 411 may set the node SEN0 to the level of the reference voltage VSEN0 (for example, 1.3V), and transistor 421 may set the node SEN1 to the level of the reference voltage VSEN1 (for example, 0.5V).

After the bit line pre-charge period PC ends, the control signal BLC0 is pulled down, so the transistor 412 is turned off. After the transistors 412 and 422 are turned off, a word line WL turns on the memory cell to be read, so that the memory cell to be read outputs data to the pre-charged bit line BLa. Next, during an initialization period 1301 of a word line enable period WLE, the control signals SENC0 and SENC1 turn on the transistors 411 and 421, and the control signals BLC0 and BLC1 turn off the transistors 412 and 422. The transistors 411 and 421 may set the levels of the nodes SEN0 and SEN1 to the levels of the reference voltages VSEN0 and VSEN1 during the initialization period 1301.

After the initialization period 1301 ends, the control signal SENC0 is pulled up (for example, from 0V to 1.3V) to turn off the transistor 411. Then, during a sense period 1302 of the word line enable period WLE, the control signal SENC0 is at a high level (for example, 1.3V) and the control signal SENC1 is at a low level (for example, 0V), so that when the sense amplifier 410 outputs the amplified signal of the corresponding signal on the bit line BLa to the node SEN0, the transistor 421 may set the node SEN1 to the level of the reference voltage VSEN1 (for example, 0.5V). During the sense period 1302, the control signal BLC0 is pulled up again and the control signal BLC1 is maintained at a low level, so the transistor 422 is turned off and the transistor 412 may sense the bit line BLa. During the period of the sense amplifier 410 sensing the bit line BLa, the control signal SENC1 turns on the transistor 421 and the control signal BLC1 turns off the transistor 422.

In summary, the disclosure provides a two stages sense amplifier (sense amplification device 400). In the sense amplification device 400, the small signal (data signal) of the bit line BLa or BLb is amplified by the first stage sense amplifier 410 or 420. Then, the amplified signal is outputted to the second stage sense amplifier 430. The sense amplifier 430 may receive the amplified differential signal and perform a second stage amplification operation on the amplified differential signal. Therefore, the sense amplification device 400 may sense the data of the bit lines BLa and/or BLb. The intensity of the differential signal received by the sense amplifier 430 is greater than the intensity of the differential signal received by the sense amplifier 150 shown in FIG. 1. Although the process is shrunk, the sense amplification device 400 may still implement sufficient sense signal margin. Therefore, the sense amplification device 400 may not require high-precision bit line capacitance matching. The edge sub-array (for example, sub-array 110 or 140 shown in FIG. 1) may be provided with the sense amplification device 400 on both sides, and all memory cells of the edge sub-array may be used.

Although the disclosure has been disclosed according to the foregoing embodiments, the embodiments are not intended to limit the disclosure. Any person skilled in the art may make changes and modifications without departing from the spirit and scope of the disclosure. Therefore, the protection scope of the disclosure shall be defined by the subsequent appended claims.

What is claimed is:

1. A sense amplification device, comprising:
   a first sense amplifier, having an input terminal coupled to a first bit line and amplifying data signals of the first bit line;
   a second sense amplifier, having an input terminal coupled to a second bit line and amplifying data signals of the second bit line; and
   a third sense amplifier, having a differential input pair and a differential output pair, wherein a first input terminal of the differential input pair is coupled to an output terminal of the first sense amplifier, a second input terminal of the differential input pair is coupled to an output terminal of the second sense amplifier, a first output terminal of the differential output pair is directly coupled to the input terminal of the first sense amplifier, and a second output terminal of the differential output pair is directly coupled to the input terminal of the second sense amplifier,
   wherein the first sense amplifier comprises:
      a first transistor, having a first terminal coupled to a first reference voltage, wherein a second terminal of the first transistor is directly coupled to the output terminal of the first sense amplifier, and a control terminal of the first transistor is controlled by a first control signal; and
      a second transistor, having a first terminal directly coupled to the input terminal of the first sense amplifier, wherein a second terminal of the second transistor is directly coupled to the second terminal of the first transistor, and a control terminal of the second transistor is controlled by a second control signal,
      wherein the first transistor comprises a p-channel metal oxide semiconductor (PMOS) transistor and the second transistor comprises an n-channel metal oxide semiconductor (NMOS) transistor, wherein
      during a bit line pre-charge period before a word line enable period, the first control signal turns on the first transistor and the second control signal drives the second transistor to pre-charge the first bit line, during an initialization period of the word line enable period, the first control signal turns on the first transistor and the second control signal turns off the second transistor, and during a sense period of the word line enable period after the initialization period, the first control signal turns off the first transistor and the second control signal drives the second transistor to sense the first bit line.

2. The sense amplification device according to claim 1, wherein each of the first sense amplifier and the second sense amplifier is a non-differential signal amplifier, and the third sense amplifier is a differential signal amplifier.

3. The sense amplification device according to claim 1, wherein during the sense period and in a case where data of the first bit line is in a first logic state, the second transistor is turned off; and during the sense period and in a case where the data of the first bit line is in a second logic state, the second transistor is turned on.

4. The sense amplification device according to claim 1, wherein during a period of the second sense amplifier sensing the second bit line, the first control signal turns on the first transistor and the second control signal turns off the second transistor.

5. The sense amplification device according to claim 1, wherein the first sense amplifier further comprises:

a control circuit, having an input terminal coupled to the input terminal of the first sense amplifier and configured to generate the second control signal to the control terminal of the second transistor, wherein the control circuit dynamically adjusts the second control signal according to a level of the input terminal of the first sense amplifier.

6. The sense amplification device according to claim 5, wherein the control circuit comprises:

a third transistor, having a first terminal receiving a third control signal, wherein a second terminal of the third transistor is coupled to an output terminal of the control circuit to generate the second control signal to the control terminal of the second transistor, and a control terminal of the third transistor is controlled by a second reference voltage; and a fourth transistor, having a first terminal receiving a fourth control signal, wherein a second terminal of the fourth transistor is coupled to the second terminal of the third transistor, and a control terminal of the fourth transistor is coupled to the input terminal of the control circuit.

7. The sense amplification device according to claim 6, wherein the third transistor comprises a PMOS transistor and the fourth transistor comprises an NMOS transistor.

8. The sense amplification device according to claim 1, wherein the third sense amplifier comprises:

a fifth transistor, having a first terminal coupled to a first voltage, wherein a second terminal of the fifth transistor is coupled to the first output terminal of the third sense amplifier, and a control terminal of the fifth transistor is coupled to the second output terminal of the third sense amplifier;

a sixth transistor, having a first terminal coupled to the first voltage, wherein a second terminal of the sixth transistor is coupled to the second output terminal of the third sense amplifier, and a control terminal of the sixth transistor is coupled to the first output terminal of the third sense amplifier;

a seventh transistor, having a first terminal coupled to a second voltage, wherein a second terminal of the seventh transistor is coupled to the first output terminal of the third sense amplifier, and a control terminal of the seventh transistor is coupled to the second input terminal of the third sense amplifier; and an eighth transistor, having a first terminal coupled to the second voltage, wherein a second terminal of the eighth transistor is coupled to the second output terminal of the third sense amplifier, and a control terminal of the eighth transistor is coupled to the first input terminal of the third sense amplifier.

9. A sense amplification device, comprising:

a first sense amplifier, having an input terminal coupled to a first bit line;

a second sense amplifier, having an input terminal coupled to a second bit line; and a third sense amplifier, having a differential input pair and a differential output pair, wherein a first input terminal of the differential input pair is coupled to an output terminal of the first sense amplifier, a second input terminal of the differential input pair is coupled to an output terminal of the second sense amplifier, a first output terminal of the differential output pair is coupled to the input terminal of the first sense amplifier, and a second output terminal of the differential output pair is coupled to the input terminal of the second sense amplifier, wherein the first sense amplifier comprises:

a first transistor, having a first terminal coupled to a first reference voltage, wherein a second terminal of the first transistor is coupled to the output terminal of the first sense amplifier, and a control terminal of the first transistor is controlled by a first control signal; and a second transistor, having a first terminal coupled to the input terminal of the first sense amplifier, wherein a second terminal of the second transistor is coupled to the second terminal of the first transistor, and a control terminal of the second transistor is controlled by a second control signal, wherein during a bit line pre-charge period before a word line enable period, the first control signal turns on the first transistor and the second control signal drives the second transistor to pre-charge the first bit line, during an initialization period of the word line enable period, the first control signal turns on the first transistor and the second control signal turns off the second transistor, during a sense period of the word line enable period after the initialization period, the first control signal turns off the first transistor and the second control signal drives the second transistor to sense the first bit line, during the sense period and in a case where data of the first bit line is in a first logic state, the second transistor is turned off, and during the sense period and in a case where the data of the first bit line is in a second logic state, the second transistor is turned on.

* * * * *